United States Patent
Cai et al.

(10) Patent No.: US 12,003,093 B2
(45) Date of Patent: Jun. 4, 2024

(54) ELECTROSTATIC PROTECTION CIRCUIT, DISPLAY SUBSTRATE AND DISPLAY APPARATUS

(71) Applicants: Chengdu BOE Optoelectronics Technology Co., Ltd., Sichuan (CN); BOE TECHNOLOGY GROUP CO., LTD., Beijing (CN)

(72) Inventors: Jianchang Cai, Beijing (CN); Yue Long, Beijing (CN); Yudiao Cheng, Beijing (CN); Hongjun Zhou, Beijing (CN); Lili Du, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 245 days.

(21) Appl. No.: 17/765,530

(22) PCT Filed: Jun. 15, 2021

(86) PCT No.: PCT/CN2021/100075
§ 371 (c)(1),
(2) Date: Mar. 31, 2022

(87) PCT Pub. No.: WO2022/022124
PCT Pub. Date: Feb. 3, 2022

(65) Prior Publication Data
US 2022/0320851 A1 Oct. 6, 2022

(30) Foreign Application Priority Data
Jul. 29, 2020 (CN) .......................... 202010744299.7

(51) Int. Cl.
*H02H 7/00* (2006.01)
*H10K 59/131* (2023.01)
*H10K 59/121* (2023.01)

(52) U.S. Cl.
CPC .......... *H02H 7/008* (2013.01); *H10K 59/131* (2023.02); *H10K 59/1216* (2023.02)

(58) Field of Classification Search
CPC .............. H10K 59/131; H10K 59/1216; H01L 27/0288; H01L 27/0296; H01L 27/124;
(Continued)

(56) References Cited

U.S. PATENT DOCUMENTS

2019/0057632 A1   2/2019   Kim et al.
2019/0066595 A1*  2/2019   Kim ....................... G09G 3/006

FOREIGN PATENT DOCUMENTS

CN   104795428 A   7/2015
CN   109427752 A   3/2019
(Continued)

OTHER PUBLICATIONS

Machine translation of Bao et al Chinese Patent Document CN 109935571 A Jun. 2019 (Year: 2019).*

(Continued)

*Primary Examiner* — Kevin J Comber
(74) *Attorney, Agent, or Firm* — HOUTTEMAN LAW LLC (57) ABSTRACT

Disclosed are an electrostatic protection circuit, a display substrate and a display apparatus. The electrostatic protection circuit includes: a plurality of first transistors (11) on a base substrate, each of which includes a gate, an active layer (112), a first electrode (113), a second electrode (114) and a connection part (115). Gates of the first transistors (11) are connected to each other to form a control line (12). The first electrode (113) of each first transistor (11) is electrically (Continued)

connected to a panel crack detect line (PL), the connection part (115) is connected between the first electrode (113) and the second electrode (114), and the active layer (112) and the gate of each first transistor (11) are arranged in an overlapping manner and insulated and separated from each other to form a first capacitor. The control line (12) is electrically connected to a first power supply line (VSS).

15 Claims, 4 Drawing Sheets

(58) Field of Classification Search
 CPC ............... H02H 7/008; G09G 3/2092; G09G 2300/043; G09G 2300/04; G09G 2330/04; G09G 2330/12
 USPC ........................................................ 361/111
 See application file for complete search history.

(56) References Cited

FOREIGN PATENT DOCUMENTS

| | | | | |
|---|---|---|---|---|
| CN | 109935571 | A | * 6/2019 | |
| CN | 109935571 | A | 6/2019 | |
| CN | 111445797 | A | 7/2020 | |
| CN | 111863916 | A | 10/2020 | |
| KR | 2019064254 | A | * 6/2019 | ........... G09G 3/3225 |
| WO | WO-2019205709 | A1 | * 10/2019 | ............... G09G 3/00 |

OTHER PUBLICATIONS

Machine translation of Liao et al. International Patent Document WO 2019205709 A1 Oct. 2019 (Year: 2019).*
Machine translation of Bae et al. Korean Patent Document KR 10-2019-0064254 A Jun. 2019 (Year: 2019).*

* cited by examiner

ELECTROSTATIC PROTECTION CIRCUIT, DISPLAY SUBSTRATE AND DISPLAY APPARATUS

CROSS-REFERENCE TO RELATED APPLICATION

This is a National Phase Application filed under 35 U.S.C. 371 as a national stage of PCT/CN2021/100075, filed on Jun. 15, 2021, the contents of which are incorporated herein in their entirety by reference.

TECHNICAL FIELD

The present disclosure relates to the field of display technology, and specifically relates to an electrostatic protection circuit, a display substrate and a display apparatus.

BACKGROUND

In an organic light-emitting diode (OLED) display panel, a panel crack detect (PCD) line is provided in a peripheral area around a display area to detect whether cracks are present in the display panel. In addition, since static electricity is likely to be generated on the panel crack detect line during production, an electrostatic protection circuit is typically provided in the peripheral area to protect the panel crack detect line from static electricity.

SUMMARY

To solve at least one of the problems in the existing art, the present disclosure provides an electrostatic protection circuit, a display substrate and a display apparatus.

In order to achieve the above objects, the present disclosure provides an electrostatic protection circuit, including: a plurality of first transistors on a base substrate, each of which includes a gate, an active layer, a first electrode, a second electrode and a connection part, wherein gates of the plurality of first transistors are connected to each other to form a control line; the first electrode of each first transistor is electrically connected to a panel crack detect line, the connection part is connected between the first electrode and the second electrode of the first transistor, and the active layer and the gate of the first transistor are arranged in an overlapping manner and insulated and separated from each other to form a first capacitor; and the control line is electrically connected to a first power supply line, the first power supply line and the control line are in different layers insulated and separated from each other, a first via is in an insulation layer between a layer where the first power supply line is located and a layer where the control line is located, the first power supply line is electrically connected to the control line through the first via, an orthographic projection of the first capacitor near the first via on the base substrate is spaced apart from an orthographic projection of the first via on the base substrate by a first distance, and a ratio of the first distance to a size of the first capacitor in a direction perpendicular to the connection part is greater than 0.375.

In some embodiments, the ratio of the first distance to the size of the first capacitor in the direction perpendicular to the connection part is between 0.375 and 5.

In some embodiments, the first distance is between 15 µm and 50 µm, and the size of the first capacitor in the direction perpendicular to the connection part is between 10 µm and 40 µm.

In some embodiments, the plurality of first transistors in the electrostatic protection circuit are arranged in two rows, at least one row of which includes multiple first transistors, and the control line is an annular signal line.

In some embodiments, first electrodes of the plurality of first transistors are connected to each other by a connection line, and the connection line is a semi-closed structure surrounding the control line.

In some embodiments, both ends of the connection line are electrically connected to the panel crack detect line.

In some embodiments, the panel crack detect line is between a layer where the gate of each first transistor is located and a layer where the first electrode of each first transistor is located, a gate insulation layer is between a layer where the panel crack detect line is located and the layer where the gate of each first transistor is located, and an interlayer dielectric layer is between the layer where the panel crack detect line is located and the layer where the first electrode of each first transistor is located.

In some embodiments, the connection line and the panel crack detect line are electrically connected through a second via that penetrates through the interlayer dielectric layer.

In some embodiments, the gate insulation layer and the interlayer dielectric layer both cover the panel crack detect line and the electrostatic protection circuit.

In some embodiments, the first electrode and the second electrode of each first transistor, and the connection line are connected into an integral structure.

In some embodiments, the connection part of the first transistor has a width between 3 µm and 10 µm.

In some embodiments, the first power supply line is in the same layer as the first electrode and the second electrode of each first transistor.

An embodiment of the present disclosure further provides a display substrate, including the electrostatic protection circuit as described above, wherein the display substrate has a display area and a peripheral area surrounding the display area, and the electrostatic protection circuit is in the peripheral area of the display substrate.

In some embodiments, the display substrate further includes a pixel circuit in the display area, and the pixel circuit includes: a storage capacitor and a plurality of second transistors, an active layer of each second transistor is in the same layer as the active layer of each first transistor,
a gate of each second transistor and a first electrode of the storage capacitor are in the same layer as the gate of each first transistor,
a first electrode and a second electrode of each second transistor are in the same layer as the first electrode and the second electrode of each first transistor, and
a second electrode of the storage capacitor is in the same layer as the panel crack detect line.

An embodiment of the present disclosure further provides a display apparatus including the display substrate as described above.

BRIEF DESCRIPTION OF DRAWINGS

Accompanying drawings are provided for further understanding of this disclosure and constitute a part of the specification. Hereinafter, these drawings are intended to explain the present disclosure together with the following specific implementations, but should not be considered as a limitation to the present disclosure. In the drawings.

DETAIL DESCRIPTION OF EMBODIMENTS

To make the objects, technical solutions and advantages of the present disclosure clearer, the technical solutions in the embodiments of the present disclosure will now be described clearly and completely with reference to the accompanying drawings of the embodiments of the present disclosure. Apparently, the described embodiments are a part of, but not all, the embodiments of the present disclosure. Based on the embodiments of the present disclosure described herein, all other embodiments obtained by those ordinary skilled in the art without any creative effort fall into the protection scope of the present disclosure.

The terminology used herein to describe embodiments of the present disclosure is not intended to limit and/or define the scope of the present disclosure. For example, technical or scientific terms used in the present disclosure are intended to have general meanings as understood by those of ordinary skill in the art, unless otherwise defined. It should be understood that the words "first", "second" and the like used in the present disclosure do not denote any order, quantity, or importance, but are used merely for distinguishing different components from each other. The singular forms "a", "an", "the" and the like do not denote a limitation of quantity, but rather denote the presence of at least one, unless the context clearly indicates otherwise. The word "comprise", "include" or the like means that the element or item preceding the word includes element(s) or item(s) that appear after the word or equivalents thereof, but does not exclude other elements or items. The word "connected", "coupled" or the like is not restricted to physical or mechanical connections, but may include electrical connections, whether direct or indirect connections. The words "upper", "lower", "left", "right", and the like are merely used to indicate a relative positional relationship, and when an absolute position of the described object is changed, the relative positional relationship may also be changed accordingly.

In the following description, when an element or layer is referred to as being "on" or "connected to" another element or layer, it can be directly on or connected to the other element or layer, or an intervening element or layer may be present therebetween. However, when an element or layer is referred to as being "directly on" or "directly connected to" another element or layer, there is no intervening element or layer present therebetween. The term "and/or" includes any and all combinations of one or more of the listed items.

In the manufacturing process of an organic electroluminescent display panel, an organic electroluminescent unit, after being formed on a display substrate, is typically encapsulated by a thin film encapsulation process. When an external force is applied on the display panel, especially when a flexible display panel is bent, cracks are likely to occur in the encapsulation layer, thereby impairing water vapor resistance of the encapsulation layer.

Figure 1:
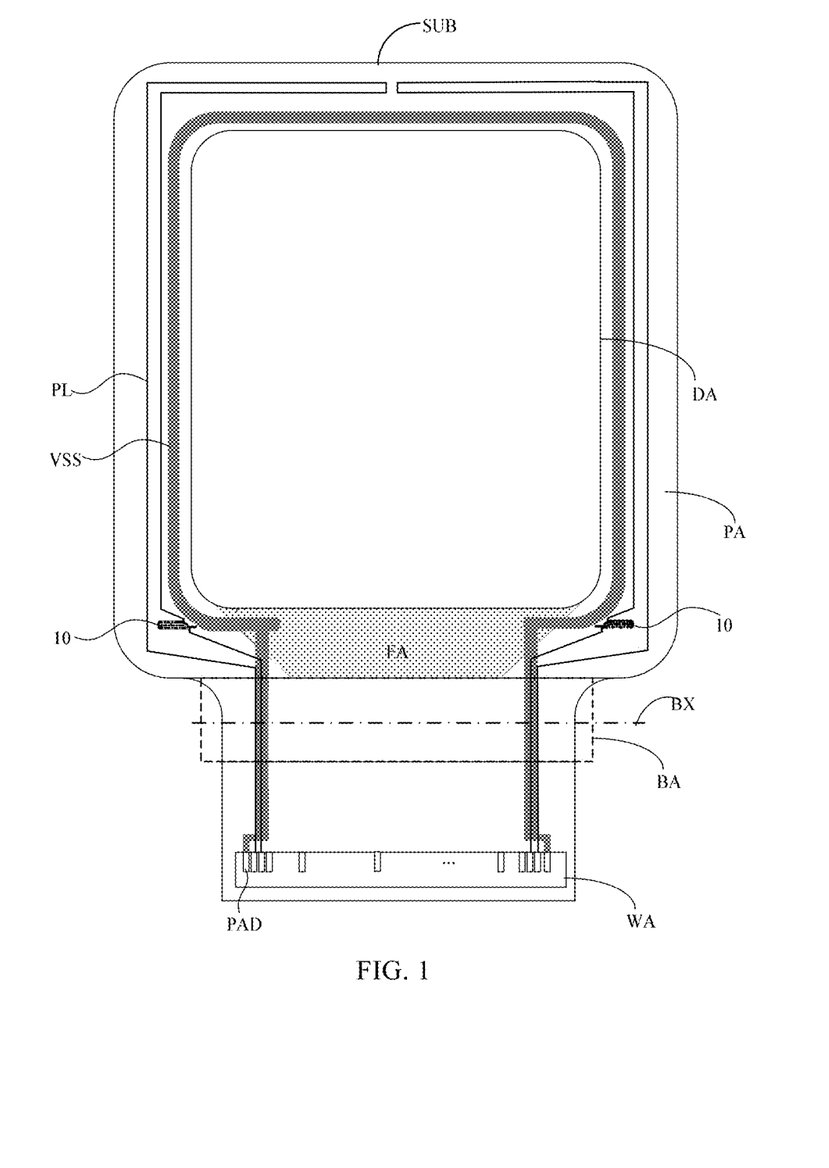
FIG. 1 is a schematic plan view of a display substrate according to some embodiments of the present disclosure.
Figure 2:
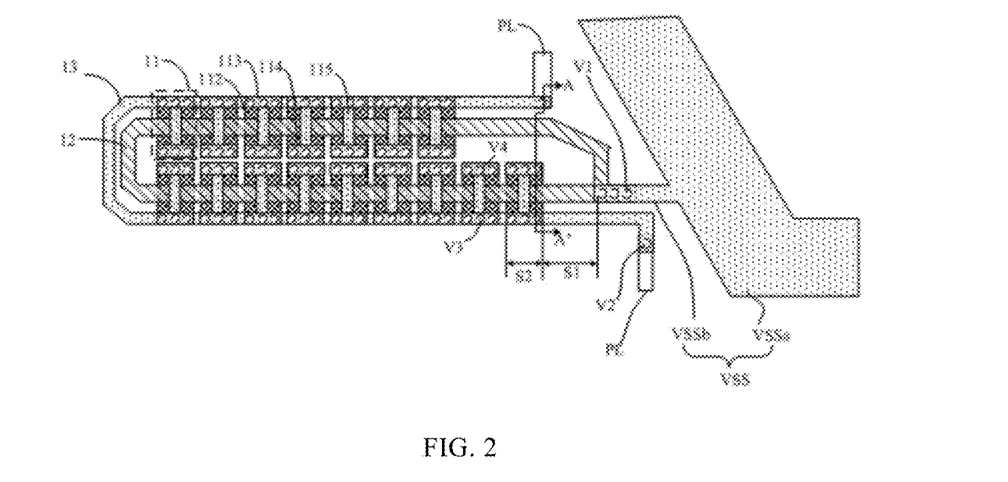
FIG. 2 is a plan view of an electrostatic protection circuit according to some embodiments of the present disclosure.
Figure 3:
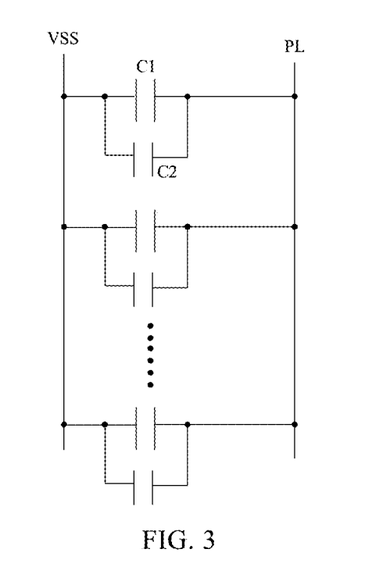
FIG. 3 is a schematic diagram of the electrostatic protection circuit shown in FIG. 2.
Figure 4:
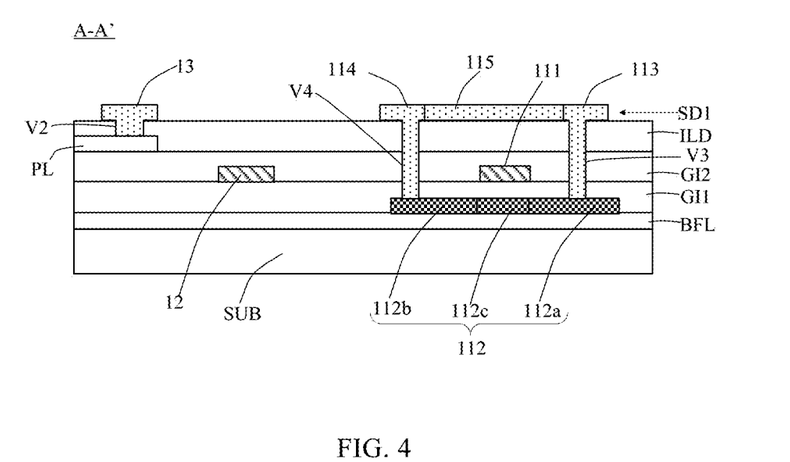
FIG. 4 is a cross-sectional view taken along line A-A' in FIG. 2.

In order to detect whether the encapsulation layer is damaged, a common method at present is to provide a panel crack detect (PCD) line around the display area. When a resistance of the detect line exceeds a normal range, it indicates that cracks are generated in the detect line and it is thus determined cracks are generated in the encapsulation layer. In addition, during the production process, static electricity tends to be generated on the display panel, and in order to prevent the panel crack detect line from being damaged by the static electricity, in some embodiments, an electrostatic protection circuit is further provided around the display area. FIG. 1 is a schematic plan view of a display substrate according to some embodiments of the present disclosure, FIG. 2 is a plan view of an electrostatic protection circuit according to some embodiments of the present disclosure, FIG. 3 is a schematic diagram of the electrostatic protection circuit shown in FIG. 2, and FIG. 4 is a cross-sectional view taken along line A-A' in FIG. 2. As shown in FIGS. 1 to 4, the electrostatic protection circuit 10 includes: a plurality of first transistors 11 on a base substrate SUB, each of which includes a gate 111, an active layer 112, a first electrode 113, a second electrode 114 and a connection part 115. Gates 111 of the plurality of first transistors 11 are connected to each other to form a control line 12. Illustratively, the gate 111 of each first transistor 11 is a part of the control line 12.

The control line 12 is electrically connected to a first power supply line VSS. The first electrode 113 of each first transistor 11 is connected to a panel crack detect line PL, the connection part 115 is connected between the first electrode 113 and the second electrode 114 of the first transistor 11, and the active layer 112 and the gate 111 of the first transistor 11 are arranged in an overlapping manner and insulated and separated from each other to form a first capacitor C1.

One of the first electrode 113 and the second electrode 114 of each first transistor 11 is a source of the first transistor 11, and the other is a drain of the first transistor 11. The active layer 112 of each first transistor 11 includes a first contact part 112a, a second contact part 112b, and a channel part 112c connected between the first contact part 112a and the second contact part 112b. The channel part 12c directly faces the gate 111, the first electrode 113 of the first transistor 11 is connected to the first contact part 112a, and the second electrode 114 of the first transistor 11 is connected to the second contact part 112b. The first power supply line VSS may provide a voltage that controls a conductive path to be formed in the channel part 112c so that the channel part 112c electrically connects the first contact part 112a and the second contact part 112b. For example, the first transistor 11 is an N-type transistor, and the first power supply line VSS is a high-level voltage line; or, the first transistor 11 is a P-type transistor, and the first power supply line VSS is a low-level voltage line. The embodiments of the present disclosure are explained by taking the case where the first transistor 11 is a P-type transistor as an example.

As shown in FIGS. 1 to 4, the first power supply line VSS supplies a voltage to the gate 111 so that a carrier channel is formed in the active layer 112, and at this time, the gate 111 and the active layer 112 serve as two electrodes of the first capacitor C1, respectively. The two electrodes of the first capacitor C1 are connected to the first power supply line VSS and the panel crack detect line PL, respectively. Meanwhile, the connection part 115 is connected to the first electrode 113 and the second electrode 114 of the first transistor 11 so that the integral structure formed by the connection part 115, the first electrode 113 and the second electrode 114 forms, together with the gate 111, a further capacitor (referred to as a second capacitor C2), and the second capacitor C2 is connected in parallel with the first capacitor C1. When static electricity is generated on the panel crack detect line PL, electrostatic charges are stored in the first capacitor C1 and the second capacitor C2, thereby preventing static charges remaining on the panel crack detect line PL from affecting the panel crack detect line PL and surrounding devices.

In practical applications, the first capacitor C1 and the second capacitor C2 may be configured according to a quantity of electrostatic charges that may be generated on the panel crack detect line PL. For example, when the display substrate is used in a large-sized display apparatus (e.g., a mobile phone or a tablet), more static charges are accordingly generated on the panel crack detect line PL. At this time, the first capacitor C1 and/or the second capacitor C2 may have an increased capacitance value to improve the charge storage capacity of the first capacitor C1 and/or the second capacitor C2. When the display substrate is used in a small-sized display apparatus (e.g., a watch or a wristband), the first capacitor C1 and/or the second capacitor C2 may have a decreased capacitance value to reduce bezel space occupied by the electrostatic protection circuit 10. Adjustment of the capacitance value of the capacitor may be implemented by adjusting an opposite area of two electrodes of the capacitor. For example, for the first capacitor C1, a size of the active layer 112 in a direction perpendicular to the connection part 15 (hereinafter referred to as a width of the active layer 112) may be adjusted to adjust an overlapping area of the active layer 112 and the gate 111, and thus to adjust the capacitance value of the first capacitor C1. It should be noted that the connection part 15 extends in a direction in which the first electrode 113 and the second electrode 114 of the first transistor are arranged; and "a direction perpendicular to the connection part 15" refers to a direction perpendicular to an extending direction of the connection part 15. It should be further noted that two directions (or structures) "perpendicular to each other" in the present disclosure means that an angle between the two is approximately a right angle, for example, between 85° and 90°. For example, in FIG. 2, the extending direction of the connection part 15 is an up-down direction, and the direction perpendicular to the connection part 15 is substantially a width direction of the connection part 15, that is, along the left-right direction in FIG. 2.

In an embodiment of the present disclosure, the first power supply line VSS and the control line 12 are in different layers insulated and separated from each other, and a first via V1 is provided in an insulation layer between a layer where the first power supply line VSS is located and a layer where the control line 12 is located, and the first power supply line VSS is electrically connected to the control line 12 through the first via V1. Optionally, the first power supply line VSS includes a body part VSSa and a transmission part VSSb. The transmission part VSSb has one end connected to the body part VSSa, and the other end connected to the control line 12 through the first via V1. As shown in FIG. 2, an orthographic projection of the first capacitor C1 near the first via V1 on the base substrate SUB is spaced apart from an orthographic projection of the first via V1 on the base substrate SUB by a first distance S1.

When the first capacitor C1 stores too much charges and discharges, the first capacitor C1 may be broken down. If the first distance S1 is too small, the discharge of the first capacitor C1 may cause a conductive portion in the first via V1 to be short-circuited with the broken-down first capacitor C1, causing a voltage on the first power supply line VSS to be continuously loaded on the panel crack detect line PL, affecting resistance detection of the panel crack detect line PL and thus affecting the crack detection result.

In view of this, in an embodiment of the present disclosure, the first distance S1 is set to a larger value. For example, a ratio of the first distance S1 to a size S2 of the first capacitor C1 in the direction perpendicular to the connection part 115 is greater than 0.375 (i.e., S1/S2>0.375). Thereby, the conductive portion in the first via V1 is prevented from being short-circuited with the broken-down first capacitor C1, the panel crack detect line PL is prevented from being electrically connected with the first power supply line VSS, and the crack detection result is prevented from being affected.

In some embodiments, the ratio of S1 to S2 is between 0.375 and 5, thereby avoiding occupation of too much bezel space due to a too large value of the first distance S1 while preventing the conductive portion in the first via V1 from being short-circuited to the broken-down first capacitor C1. For example, S1/S2 is 0.5, or 1, or 2, or 3, or the like.

In some specific examples, S1 is between 15 μm and 50 μm, and S2 is between 10 μm and 40 μm. When the electrostatic protection circuit 10 is used in a display product (e.g., a mobile phone or a tablet) with a larger size and a wider bezel, the charge storage capacity of the first capacitor C1 is desired to be improved, while the requirement on a speed at which the charges are guided into the first capacitor C1 is not high. In this case, S2 may be set to be larger, and S1 may be set to be smaller, as long as S1/S2 is greater than 0.375. For example, S1 is between 15 μm and 30 μm, S2 is between 20 μm and 40 μm. When the electrostatic protection circuit 10 is used in a display product with a smaller size and a narrower bezel, the speed at which the charges are guided into the first capacitor C1 is desired to be increased. In this case, S2 may be set to be smaller, and S1 may be set to be larger. For example, S1 is between 25 μm and 35 μm, and S2 is between 10 μm and 25 μm.

In some embodiments, the plurality of first transistors 11 in the electrostatic protection circuit 10 are arranged in two rows, at least one row includes multiple first transistors 11, and the control line 12 is an annular signal line. It should be noted that "annular" does not necessarily mean a circular ring shape, but may be an irregularly shaped ring as long as a closed loop can be formed.

In some embodiments, the first electrodes 113 of the plurality of first transistors 11 are connected to each other by a connection line 13, and the connection line 13 is a semi-closed structure surrounding the control line 12. That is, the first electrodes 113 of the first transistors 11 in a first row are away from the first transistors 11 in a second row, and the second electrodes 114 of the first transistors 11 in the first row are closer to the first transistors 11 in the second row; and the first electrodes 113 of the first transistors 11 in the second row are away from the first transistors 11 in the first row, the second electrodes 114 of the first transistors 11 in the second row are closer to the first transistors 11 in the first row, and the connection line 13 is disposed along an outer periphery of the control line 12.

For example, both ends of the connection line 13 are connected to the panel crack detect line PL.

As shown in FIG. 4, the active layer 112 of the first transistor 11 is disposed on the base substrate SUB, which is a flexible base substrate SUB and may be made of a flexible organic material. For example, the organic material is a resin-based material such as polyimide, polycarbonate, polyacrylate, polyetherimide, polyethersulfone, polyethylene terephthalate, polyethylene naphthalate, and the like. The active layer 112 may be made of a material including, for example, an inorganic semiconductor material (e.g., polysilicon, amorphous silicon, etc.), an organic semiconductor material, or an oxide semiconductor material. The first contact part 112a and the second contact part 112b of the active layer 112 may each be doped with an impurity (e.g., an N-type impurity or a P-type impurity) of a concentration higher than that in the channel part 112c. The channel part 112c directly faces the gate 111 of the first transistor 11, and when a voltage signal applied to the gate 111 reaches a predetermined value, a carrier path is formed in the channel part 112c.

A buffer layer BFL may be further disposed between the active layer 112 of the first transistor 11 and the base substrate SUB, and configured to prevent or reduce diffusion of metal atoms and/or impurities from the base substrate SUB into the active layer 112 of the first transistor 11. For example, the buffer layer BFL may include an inorganic material such as silicon oxide (SiOx), silicon nitride (SiNx), and/or silicon oxynitride (SiON), and may be formed as a multi-layer or single-layer structure.

A first gate insulation layer GI1 is disposed on the active layer 112, and may be made of a material including a silicon compound or a metal oxide. For example, the material of the first gate insulation layer GI1 includes silicon oxynitride (SiON), silicon oxide (SiOx), silicon nitride (SiNx), silicon oxycarbide (SiOxCy), silicon carbonitride (SiCxNy), aluminum oxide (AlOx), aluminum nitride (AlNx), tantalum oxide (TaOx), hafnium oxide (HfOx), zirconium oxide (ZrOx), titanium oxide (TiOx), or the like. In addition, the first gate insulation layer GI1 may be a single-layer or multi-layer structure.

The gate 111 is disposed on the first gate insulation layer GI1, and may be made of a material including, for example, a metal, a metal alloy, a metal nitride, a conductive metal oxide, a transparent conductive material, or the like. For example, the gate 111 may include gold (Au), an alloy of gold, silver (Ag), an alloy of silver, aluminum (Al), an alloy of aluminum, aluminum nitride (AlNx), tungsten (W), tungsten nitride (WNx), copper (Cu), an alloy of copper, nickel (Ni), chromium (Cr), chromium nitride (CrNx), molybdenum (Mo), an alloy of molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), stannous oxide (SnOx), indium oxide (InOx), gallium oxide (GaOx), indium tin oxide (ITO), indium zinc oxide (IZO), or the like. The gate 111 may have a single-layer or multi-layer structure.

A second gate insulation layer GI2 is disposed on the gate 111, and may be made of a material including, for example, a silicon compound or a metal oxide. For example, the material of the second gate insulation layer GI2 may include silicon oxynitride (SiON), silicon oxide (SiOx), silicon nitride (SiNx), silicon oxycarbide (SiOxCy), silicon carbonitride (SiCxNy), aluminum oxide (AlOx), aluminum nitride (AlNx), tantalum oxide (TaOx), hafnium oxide (HfOx), zirconium oxide (ZrOx), titanium oxide (TiOx), or the like. The second gate insulation layer GI2 may be formed as a single-layer or multi-layer structure.

The panel crack detect line PL is disposed on the second gate insulation layer GI2, and may be made of a material including, for example, a metal, a metal alloy, a metal nitride, a conductive metal oxide, a transparent conductive material, or the like. For example, the gate layer may include gold (Au), an alloy of gold, silver (Ag), an alloy of silver, aluminum (Al), an alloy of aluminum, aluminum nitride (AlNx), tungsten (W), tungsten nitride (WNx), copper (Cu), an alloy of copper, nickel (Ni), chromium (Cr), chromium nitride (CrNx), molybdenum (Mo), an alloy of molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), stannous oxide (SnOx), indium oxide (InOx), gallium oxide (GaOx), indium tin oxide (ITO), indium zinc oxide (IZO), or the like. The panel crack detect line PL may have a single-layer or multi-layer structure.

An interlayer dielectric layer ILD is disposed on a layer where the panel crack detect line PL is located, and may be made of a material including, for example, a silicon compound, a metal oxide, or the like. In particular, the silicon compounds and metal oxides listed above may be selected and will not be described in detail here.

A first source-drain conductive layer SD1 is disposed on the interlayer dielectric layer ILD, and may include the first electrode 113, the second electrode 114, and the connection part 115 of each first transistor 11, and the connection line 13. The first electrode 113, the second electrode 114, and the connection part 115 of each first transistor 11, and the connection line 13 may form an integral structure. The first electrode 113 and the second electrode 114 may extend in a length direction of the gate 111, and an extending direction of the connection part 115 intersects with an extending direction of the gate 111, for example, the extending direction of the connection part 115 is perpendicular to the extending direction of the gate 111. Illustratively, a width of the connection part 115 is smaller than lengths of the first electrode 113 and the second electrode 114 of the first transistor 11, and optionally, the width of the connection part 115 is between 3 μm and 10 μm, for example, 5 μm. The first electrode 113 of the first transistor 11 is connected to the first contact part 112a of the active layer 112 through one or more third vias V3, and the second electrode 114 of the first transistor 11 is connected to the second contact part 112b of the active layer 112 through one or more fourth vias V4. Each third via V3 and each fourth via V4 penetrate through the first gate insulation layer GI1, the second gate insulation layer GI2 and the interlayer dielectric layer ILD.

The first source-drain conductive layer SD1 may include a metal, an alloy, a metal nitride, a conductive metal oxide, a transparent conductive material, or the like. For example, the first source-drain conductive layer may be a single-layer or multi-layer structure formed of a metal, such as Mo/Al/Mo or Ti/Al/Ti. In addition, the first source-drain conductive layer SD1 further includes the first power supply line VSS. That is, the first power supply line VSS is disposed in the same layer as the first electrode 113 of the first transistor 11. It should be noted that "disposed in the same layer" means that two structures are formed from a same material layer through a patterning process, and therefore, the two structures are in a same layer in the layer relation, but this does not necessarily mean that the two structures have a same distance to the base substrate SUB.

The first power supply line VSS is connected to the control line 12 through the first via V1. The first via V1 penetrates through the second insulation layer GI2 and the interlayer dielectric layer ILD, and exposes a portion of the control line 12. In order to improve connection stability between the first power supply line VSS and the control line 12, a plurality of first vias V1 may be provided. For example, three first vias V1 are provided.

The connection line 13 is connected to the panel crack detect line PL through the second via penetrating through the interlayer dielectric layer ILD. For example, both ends of the connection line 13 are connected to the panel crack detect line PL through a plurality of vias to improve connection stability.

An embodiment of the present disclosure further provides a display substrate, including the electrostatic protection circuit 10 as described in the above embodiments.

The display substrate has a display area DA and a peripheral area PA surrounding the display area DA. Elements for displaying an image, such as a pixel circuit, a scanning line, a data line, a light-emitting device, and the like, may be disposed in the display area DA. The light-emitting device may be an organic light-emitting diode (OLED) that can emit, for example, red, green, blue or white light. The pixel circuit may include a storage capacitor and a plurality of second transistors. The light-emitting device has a first electrode (e.g., anode) connected to the second transistor in the pixel circuit, and a second electrode (e.g., cathode) connected to the first power supply line VSS.

Figure 5:
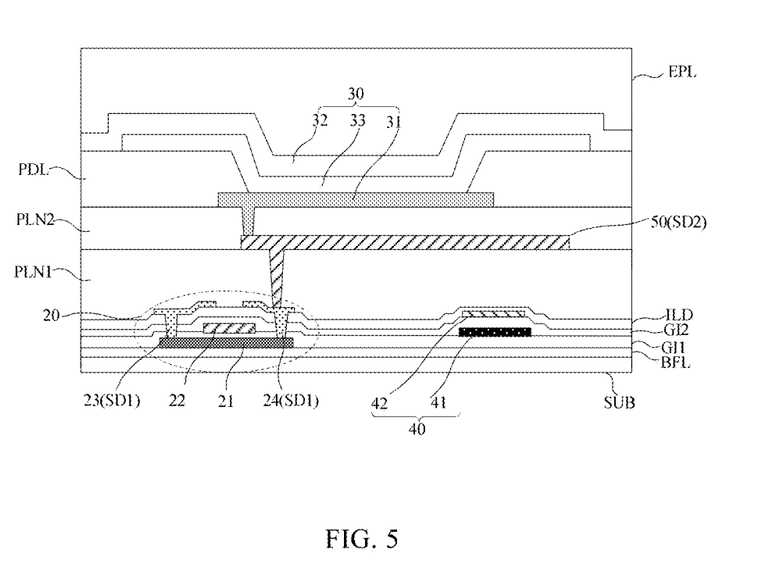
FIG. 5 is a schematic structural diagram of layers in a display area according to an embodiment of the present disclosure.

FIG. 5 is a schematic structural diagram of layers in a display area according to an embodiment of the present disclosure. As shown in FIGS. 4 and 5, the first electrode 41 of the storage capacitor 40 in the pixel circuit, the gate 22 of each second transistor 20 in the pixel circuit, and the gate 111 of each first transistor 11 in the electrostatic protection circuit 10 may be disposed in a same layer, and the second electrode 42 of the storage capacitor 40 in the pixel circuit may be disposed in the same layer as the panel crack detect line PL. The active layer 21 of each second transistor 20 in the pixel circuit is disposed in the same layer as the active layer 112 of each first transistor 11 in the electrostatic protection circuit 10. The first electrode 23 and the second electrode 24 of each second transistor 20 in the pixel circuit, and the first electrode 113 and the second electrode 114 of each first transistor 11 in the electrostatic protection circuit 10 are disposed in a same layer, i.e., the first source-drain conductive layer SD1. The buffer layer BFL, the first gate insulation layer GI1, the second gate insulation layer GI2, and the interlayer dielectric layer ILD each extend to the display area DA so that in the pixel circuit, the active layer 21 of each second transistor 20 is spaced apart from the base substrate SUB by the buffer layer BFL, the gate 22 and the active layer 21 of each second transistor 20 are spaced apart by the first gate insulation layer GI1, the first electrode 41 and the second electrode 41 of the storage capacitor 40 are spaced apart by the second gate insulation layer GI2, and the second electrode 42 of the storage capacitor 40 is spaced apart from the first source-drain conductive layer SD1 by the interlayer dielectric layer ILD.

As shown in FIG. 5, a first planarization layer PLN1 is disposed on a side of the first source-drain conductive layer SD1 away from the base substrate SUB, and a surface of the first planarization layer PLN1 away from the base substrate SUB is substantially flat. The first planarization layer PLN1 may cover the display area DA, and cover the electrostatic protection circuit 10 and the panel crack detect line PL. The first planarization layer PLN1 is made of an organic insulating material including, for example, a resin-based material such as polyimide, epoxy, acryl, polyester, photoresist, polyacrylate, polyamide, siloxane, or the like. As another example, the organic insulating material includes an elastic material, such as ethyl urethane, thermoplastic polyurethane (TPU), or the like.

A second source-drain conductive layer SD2 is disposed on a side of the first planarization layer PLN1 away from the base substrate SUB, and may include a transfer electrode 50 in the display area DA. The transfer electrode 50 is electrically connected to the second electrode 24 of a second transistor in the pixel circuit through a via penetrating through the first planarization layer PLN1, and at the same time, the transfer electrode 50 is further electrically connected to the first electrode 31 of a light-emitting device 30 through a via penetrating through the second planarization layer PLN2. With the transfer electrode 50, vias having a relatively large aperture directly formed in the first planarization layer PLN1 and the second planarization layer PLN2 are avoided, thereby improving the quality of via electrical connection. The second source-drain conductive layer SD2 may be made of a material including a metal, an alloy, a metal nitride, a conductive metal oxide, a transparent conductive material, or the like. For example, the second source-drain conductive layer SD2 may be a single-layer or multi-layer structure formed of a metal, such as Mo/Al/Mo or Ti/Al/Ti. The material of the second source-drain conductive layer SD2 may be the same as or different from the material of the first source-drain conductive layer SD1.

The second planarization layer PLN2 is disposed on the second source-drain conductive layer SD2 and covers the transfer electrode 50, and has a substantially flat upper surface. The second planarization layer PLN2 is made of an organic insulating material including, for example, a resin-based material such as polyimide, epoxy, acryl, polyester, photoresist, polyacrylate, polyamide, siloxane, or the like. As another example, the organic insulating material includes an elastic material, such as ethyl urethane, thermoplastic polyurethane (TPU), or the like. The material of the second planarization layer PLN2 may be the same as or different from the material of the first planarization layer PLN1.

A pixel defining layer PDL is disposed on a side of the second planarization layer PLN2 away from the base substrate SUB. The pixel defining layer PDL includes pixel openings in one-to-one correspondence with the light-emitting devices 30. The pixel defining layer PDL may be made of a material including an organic insulating material such as polyimide, polyphthalamide, acrylic resin, benzocyclobutene, or phenol resin.

The light-emitting device 30 includes a first electrode 31, a light-emitting layer 33, and a second electrode 32. The first electrode 31 is located between the second planarization layer PLN2 and the pixel defining layer PDL, the light-emitting layer 33 is located in a corresponding pixel opening, and the second electrode 32 is located on a side of the light-emitting layer 33 away from the base substrate SUB. Second electrodes 32 of all the light-emitting devices 30 in the display area DA are connected integrally to form a second electrode layer. The first electrode 31 is an anode of the light-emitting device 30, and the second electrode 32 is a cathode. The first electrode 31 is electrically connected to the transfer electrode 50 through a via penetrating through the second planarization layer PLN2, and thus is electrically connected to the second electrode 24 of a second transistor 20 in the pixel circuit. The first electrode 31 may be made of a material such as a metal, a metal alloy, a metal nitride, a conductive metal oxide, a transparent conductive material, or the like. The first electrode 31 may have a single-layer or multi-layer structure. A portion of the first electrode 31 is exposed by the pixel opening.

The light-emitting layer 33 may include a small molecule organic material or a polymer molecule organic material, which may be a fluorescent light-emitting material or a phosphorescent light-emitting material that can emit red light, green light, blue light, or white light. The second electrode 32 is located on a side of the light-emitting layer away from the base substrate SUB, and may be made of a metal, a metal alloy, a metal nitride, a conductive metal oxide, a transparent conductive material, or the like. In an embodiment of the present disclosure, the light-emitting device 30 may have a top emission type structure or a bottom emission type structure. In the case of a top emission type structure, the first electrode 31 includes a conductive material having a light reflection property or includes a light reflective film, and the second electrode 32 includes a transparent or translucent conductive material. In the case of a bottom emission type structure, the second electrode 32 is made of a conductive material having a light reflection property or includes a light reflective film, and the first electrode 31 includes a transparent or translucent conductive material.

It should be noted that the light-emitting device 30 may further include other film layers, for example: a hole injection layer and a hole transport layer between the first electrode 31 and the light-emitting layer 33, and an electron transport layer and an electron injection layer between the light-emitting layer 33 and the second electrode 32.

An encapsulation layer EPL is disposed on a side of the light-emitting device 30 away from the base substrate SUB, and configured to encapsulate the light-emitting device 30. The encapsulation layer EPL may include two inorganic layers and an organic layer therebetween, and each inorganic layer may be made of an inorganic material with high compactness such as silicon oxynitride (SiON), silicon oxide (SiOx), or silicon nitride (SiNx). The organic layer may be made of a high polymer material containing a desiccant or a high polymer material capable of blocking water vapor.

The electrostatic protection circuit 10 is disposed in the peripheral area PA of the display substrate. Two or more electrostatic protection circuits 10 may be provided. For example, as shown in FIG. 1, the display substrate includes two electrostatic protection circuits 10 disposed near two corners of the display area DA, respectively. The peripheral area PA may include a pad area WA at one side of the display area DA. The pad area WA may be provided therein with pads PAD each configured to be electrically connected to a signal line PA extending from the display area DA or the peripheral area PA. For example, a data line may be connected to the pad PAD through a data connection line. The pads PAD may be exposed on a surface of the pad area WA, i.e., not covered by any layer, so as to facilitate electrical connection to a flexible printed circuit board (FPCB). The flexible printed circuit board is electrically connected to an external controller, and configured to transmit signals from the external controller. The pads PAD are electrically connected to the respective signal lines, thereby enabling mutual communication between the signal lines and the flexible printed circuit board. In addition, the peripheral area PA further includes a bent area BA and a fan-out area FA. The bent area BA is located between the pad area WA and the display area DA, and configured to be bent along a bending axis BX. By bending the bent area BA, the pad area WA can be located on a back side of the display substrate (a display side of the display substrate is a front side, and a side opposite to the display side is a rear side or a back side), thereby improving space utilization and reducing a bezel width of the display product. The fan-out area FA is located between the display area DA and the bent area BA, and the data connection line, after being connected to the data line, extends to the pad area WA through the fan-out area FA and the bent area BA.

In some embodiments, the first planarization layer PLN1, the second planarization layer PLN2, the pixel defining layer PDL, and the encapsulation layer EPL as described above may each cover the electrostatic protection circuit 10 and the panel crack detect line PL.

An embodiment of the present disclosure further provides a display apparatus including the display substrate as described above. The display apparatus may be an OLED panel, a mobile phone, a tablet, a television, a monitor, a laptop, a digital album, a navigator or any other product or component having a display function. The display apparatus is particularly suitable for a small-size display product such as a mobile phone or a smart bracelet.

Figure 6:
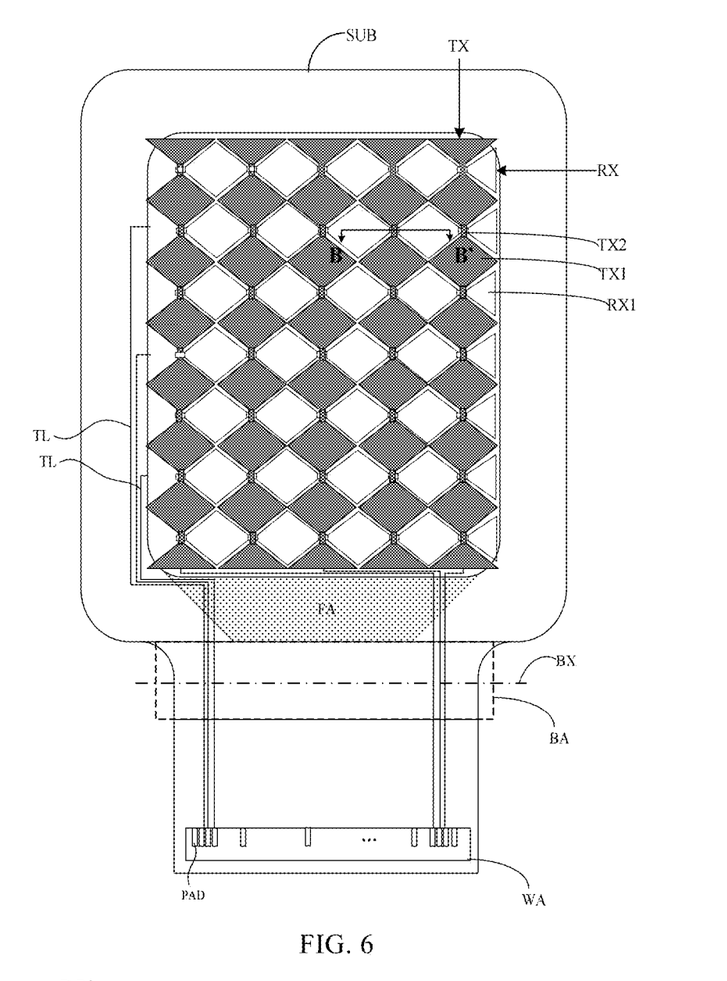
FIG. 6 is a plan view of a touch electrode pattern in an embodiment of the present disclosure.
Figure 7:
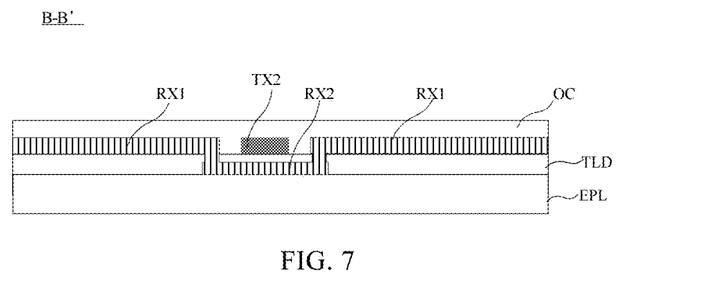
FIG. 7 is a cross-sectional view taken along line B-B' in FIG. 6.

In addition to the display substrate described above, the display apparatus may further include a touch electrode pattern disposed on the display substrate and configured to detect a touch to implement a touch function. FIG. 6 is a plan view of a touch electrode pattern in an embodiment of the present disclosure, and FIG. 7 is a cross-sectional view taken along line B-B' in FIG. 6. FIG. 7 only illustrates the encapsulation layer EPL and the touch electrode pattern above the encapsulation layer EPL; for the structures below the encapsulation layer EPL, reference may be made to the forgoing description. As shown in FIGS. 6 to 7, the touch electrode pattern includes a plurality of touch driving electrodes TX and a plurality of touch sensing electrodes RX arranged to intersect with each other, and the touch driving electrodes TX and the touch sensing electrodes RX are insulated and spaced apart by a touch insulation layer TLD at the intersections. The touch driving electrode TX includes: a plurality of driving electrode units TX1 arranged in a first direction, and first connection parts TX2 connected between the driving electrode units TX1. The touch sensing electrode RX includes a plurality of sensing electrode units RX1 and second connection parts RX2 connected between the sensing electrode units. The first direction intersects with the second direction. For example, the first direction is an up-down direction in FIG. 6, and the second direction is a left-right direction in FIG. 6. The driving electrode units TX1, the first connection parts TX2 and the sensing electrode units RX1 are all located on a side of the touch insulation layer TLD away from the base substrate SUB; the driving electrode units TX1, the first connection parts TX2 and the sensing electrode units RX1 may be disposed in a same layer; and the second connection parts RX2 are located on a side of the touch insulation layer TLD close to the base substrate SUB. The second connection parts RX2 and the first connection parts TX2 are arranged to intersect with each other and spaced apart by the touch insulation layer TLD. The sensing electrode unit RX1 is connected to the second connection part RX2 through a via in the touch insulation layer TLD. It should be noted that the touch driving electrodes TX and the touch sensing electrodes RX shown in FIGS. 6 and 7 are merely for exemplary explanation, and do not constitute any limitation to the present disclosure. For example, it is also possible that the second connection parts RX2 are located on the side of the touch insulation layer TLD away from the base substrate SUB, and the first connection parts TX2 are located on the side of the touch insulation layer TLD close to the base substrate SUB. For another example, adjacent driving electrode units TX1 are connected by a second connection part in a different layer, and adjacent sensing electrode units RX1 are connected by a first connection part in a same layer. The touch driving electrodes TX and the touch sensing electrodes RX are both connected to the pads PAD in the pad area WA through touch signal lines TL.

It will be appreciated that the above implementations are merely exemplary implementations for illustrating the principle of the present disclosure, and the present disclosure is not limited thereto. It will be apparent to one of ordinary skill in the art that various modifications and variations may be made without departing from the spirit or essence of the present disclosure. These modifications and variations should also be considered as falling into the protection scope of the present disclosure.

What is claimed is:

1. An electrostatic protection circuit, comprising: a plurality of first transistors on a base substrate, each of which comprises a gate, an active layer, a first electrode, a second electrode and a connection part,
    wherein gates of the plurality of first transistors are connected to each other to form a control line; the first electrode of each first transistor is electrically connected to a panel crack detect line, the connection part is connected between the first electrode and the second electrode of the first transistor, and the active layer and the gate of the first transistor are arranged in an overlapping manner and insulated and separated from each other to form a first capacitor; and
    the control line is electrically connected to a first power supply line, the first power supply line and the control line are in different layers insulated and separated from each other, a first via is in an insulation layer between a layer where the first power supply line is located and a layer where the control line is located, the first power supply line is electrically connected to the control line through the first via, an orthographic projection of the first capacitor near the first via on the base substrate is spaced apart from an orthographic projection of the first via on the base substrate by a first distance, and a ratio of the first distance to a size of the first capacitor in a direction perpendicular to the connection part is greater than 0.375.

2. The electrostatic protection circuit according to claim 1, wherein the ratio of the first distance to the size of the first capacitor in the direction perpendicular to the connection part is between 0.375 and 5.

3. The electrostatic protection circuit according to claim 1, wherein the first distance is between 15 μm and 50 μm, and the size of the first capacitor in the direction perpendicular to the connection part is between 10 μm and 40 μm.

4. The electrostatic protection circuit according to claim 1, wherein the plurality of first transistors in the electrostatic protection circuit are arranged in two rows, at least one row of which comprises multiple first transistors, and the control line is an annular signal line.

5. The electrostatic protection circuit according to claim 4, wherein first electrodes of the plurality of first transistors are connected to each other by a connection line, and the connection line is a semi-closed structure surrounding the control line.

6. The electrostatic protection circuit according to claim 5, wherein both ends of the connection line are electrically connected to the panel crack detect line.

7. The electrostatic protection circuit according to claim 5, wherein the panel crack detect line is between a layer where the gate of each first transistor is located and a layer where the first electrode of each first transistor is located, a gate insulation layer is between a layer where the panel crack detect line is located and the layer where the gate of each first transistor is located, and an interlayer dielectric layer is between the layer where the panel crack detect line is located and the layer where the first electrode of each first transistor is located.

8. The electrostatic protection circuit according to claim 7, wherein the connection line and the panel crack detect line are electrically connected through a second via that penetrates through the interlayer dielectric layer.

9. The electrostatic protection circuit according to claim 7, wherein the gate insulation layer and the interlayer dielectric layer both cover the panel crack detect line and the electrostatic protection circuit.

10. The electrostatic protection circuit according to claim 5, wherein the first electrode and the second electrode of each first transistor, and the connection line are connected into an integral structure.

11. The electrostatic protection circuit according to claim 1, wherein the connection part of the first transistor has a width between 3 μm and 10 μm.

12. The electrostatic protection circuit according to claim 1, wherein the first power supply line is in the same layer as the first electrode and the second electrode of each first transistor.

13. A display substrate, comprising the electrostatic protection circuit according to claim 1, wherein the display substrate has a display area and a peripheral area surrounding the display area, and the electrostatic protection circuit is in the peripheral area of the display substrate.

14. The display substrate according to claim 13, further comprising a pixel circuit in the display area, wherein the pixel circuit comprises: a storage capacitor and a plurality of second transistors,
    an active layer of each second transistor is in the same layer as the active layer of each first transistor,
    a gate of each second transistor and a first electrode of the storage capacitor are in the same layer as the gate of each first transistor,
    a first electrode and a second electrode of each second transistor are in the same layer as the first electrode and the second electrode of each first transistor, and
    a second electrode of the storage capacitor is in the same layer as the panel crack detect line.

15. A display apparatus, comprising the display substrate according to claim 13.

* * * * *